(12) United States Patent
Janesky et al.

(10) Patent No.: US 6,720,597 B2
(45) Date of Patent: Apr. 13, 2004

(54) CLADDING OF A CONDUCTIVE INTERCONNECT FOR PROGRAMMING A MRAM DEVICE USING MULTIPLE MAGNETIC LAYERS

(75) Inventors: Jason Allen Janesky, Mesa, AZ (US); Nicholas D. Rizzo, Gilbert, AZ (US); Bradley N. Engel, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 112 days.

(21) Appl. No.: 10/010,363

(22) Filed: Nov. 13, 2001

(65) Prior Publication Data

US 2003/0089933 A1 May 15, 2003

(51) Int. Cl.$^7$ ................................. H01L 29/76
(52) U.S. Cl. ................. 257/295; 257/421; 257/108; 257/252; 257/422; 438/3
(58) Field of Search .................. 257/295, 421–427, 257/108, 252, 422, 659, 338, E21.665, E43.001, E43.004; 438/3; H01L 21/8246, 43/08

(56) References Cited

U.S. PATENT DOCUMENTS 6,211,090 B1 * 4/2001 Durlam et al. .............. 438/692
2003/0042562 A1 * 3/2003 Giebeler et al. ............ 257/421

* cited by examiner

*Primary Examiner*—Nathan J. Flynn
*Assistant Examiner*—Scott Wilson
(74) *Attorney, Agent, or Firm*—William E. Koch

(57) ABSTRACT

A cladded conductive interconnect for programming a magnetoresistive memory device which includes a conductive material with a length, a first barrier conductive material positioned on the conductive material, and a multi-layer cladding region positioned along the length of the conductive material wherein the multi-layer cladding region includes N ferromagnetic layers, where N is a whole number greater than or equal to two, and wherein the multi-layer cladding region further includes at least one spacer layer, wherein the spacer layer can include a metal, an insulator, or an exchange interaction material, and wherein the spacer layer is sandwiched therebetween each adjacent ferromagnetic layer.

15 Claims, 3 Drawing Sheets

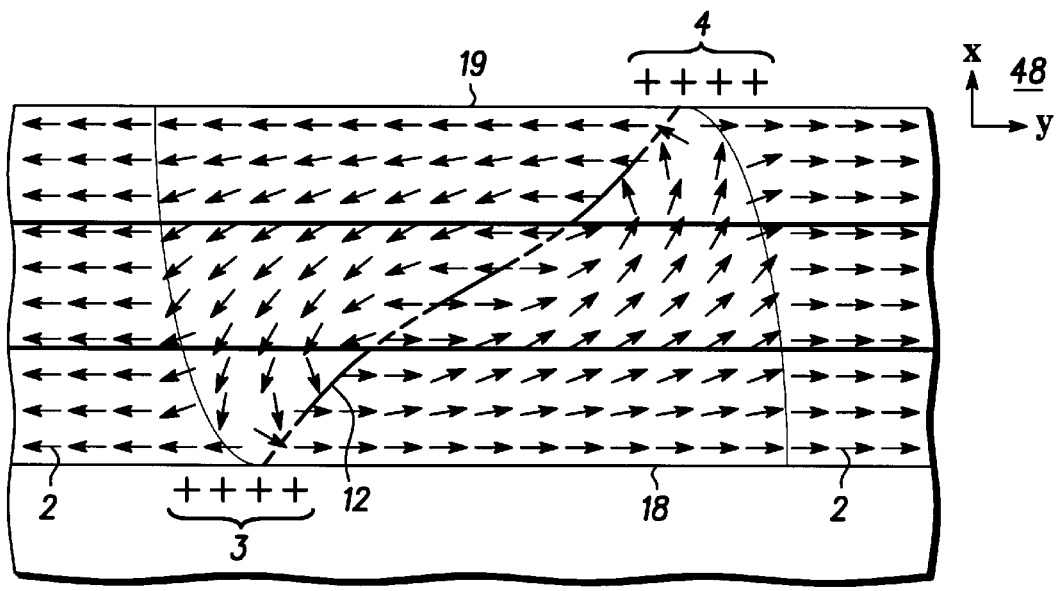
*- PRIOR ART -* *FIG. 1*
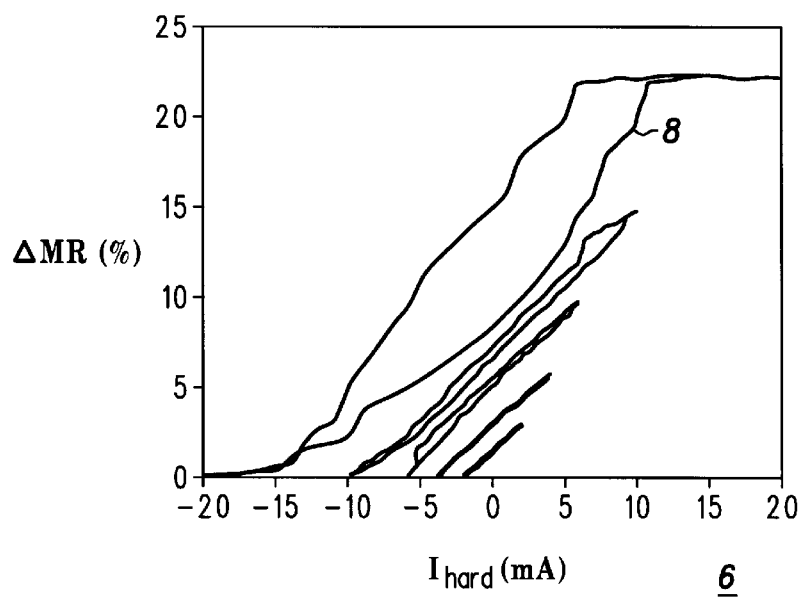
*- PRIOR ART -* *FIG. 2*

CLADDING OF A CONDUCTIVE INTERCONNECT FOR PROGRAMMING A MRAM DEVICE USING MULTIPLE MAGNETIC LAYERS

FIELD OF THE INVENTION

This invention relates to semiconductor memory devices.

More particularly, the present invention relates to an improved conductive interconnect for supplying currents to semiconductor random access memory devices that utilize a magnetic field.

BACKGROUND OF THE INVENTION

A magnetic memory device has a structure which includes ferromagnetic layers separated by a non-magnetic layer. The ferromagnetic layers have a free magnetic moment vector that can be oriented in one of several preferred directions relative to a pinned magnetic moment vector that is fixed in direction. The orientation of the free magnetic moment vector relative to the pinned magnetic moment vector creates unique resistance states that are used to represent stored information. Accordingly, a detection of changes in resistance allows a magnetic memory device to provide stored information. In typical magnetic memory devices, two resistance states are available. The stored states can be read by passing a sense current through the cell in a sense interconnect because of the difference between the magnetic resistances of the states.

In magnetoresistive random access memory (hereinafter referred to as MRAM) devices, the memory cells are programmed by magnetic fields induced by a current carrying conductor such as a copper interconnect. Typically, two conductive orthogonal interconnects are employed, with one positioned above (hereinafter referred to as the bit interconnect) the MRAM device and the second positioned below (hereinafter referred to as the digit interconnect) the MRAM device. The purpose of the bit and digit interconnects is to provide magnetic fields for programming the MRAM device.

A ferromagnetic cladding layer can be positioned on each of the conductive interconnects to significantly increase the magnitude of the magnetic field and to control its direction. The use of ferromagnetic cladding layers enables the MRAM device to be used in low power applications by reducing the magnitudes of currents required to create a given magnetic field. Additionally, the ferromagnetic cladding layers can focus the magnetic fields in a desired direction to shield adjacent MRAM devices within an MRAM device array, and, therefore, to prevent inadvertently changing the memory states of the adjacent MRAM devices. More information as to cladding a MRAM device can be found in U.S. Pat. No. 6,211,090 entitled "Method of Fabricating Flux Concentrating Layer for use with Magnetoresistive Random Access Memories" issued on Apr. 3, 2001.

One problem with using ferromagnetic cladding layers, however, is the creation of domains when high currents are passed through the conductive interconnect it partially surrounds (See FIG. 1). These domains create difficult to control remanent fields when the current in the conductive interconnect is reduced to zero and also create hysteresis in the ferromagnetic cladding response when further currents are applied.

For example, FIG. 1 illustrates a micromagnetic simulation of a single ferromagnetic cladding layer 1 which has a first side, a bottom, and a second side. It will be understood that the first side, bottom, and second side of ferromagnetic cladding layer 1 are all illustrated in the same plane for simplicity. Further, for ease of discussion, directions will be referenced to x-y coordinate system 48. The micromagnetic simulation calculates the orientation of a plurality of magnetic moment vectors 2 over a length of ferromagnetic cladding layer 1 and shows the formation of a domain 12 in the remanent state after ferromagnetic cladding layer 1 is saturated. Further, it is assumed that ferromagnetic cladding layer 1 has a thickness of 2.5 nm and includes NiFeCo.

Ideally, the plurality of magnetic moment vectors 2 would be aligned in the same direction and be oriented either parallel or anti-parallel to the length of ferromagnetic cladding layer 1 (e.g. the y-direction). However, the formation of domain 12 alters the alignment of plurality of magnetic moment vectors 2 proximate to domain 12, and, therefore, creates an induced positive charge 4 at a boundary 19 and an induced positive charge 3 at a boundary 18. Induced positive charge 3 and 4 create stray magnetic fields that can interact with the MRAM device.

Domain formation also causes hysteresis in the ferromagnetic cladding layer when subsequent currents are applied. Hysteresis limits the magnetic field response of the ferromagnetic cladding layer, and, therefore, reduces the performance of the ferromagnetic cladding layer and its ability to focus a given magnetic field at the MRAM device for a given current supplied. Thus, hysteresis can produce significant errors during the operation of the MRAM device.

FIG. 2 illustrates a plot 6 showing the change in magnetoresistance (e.g. magnetoresistance response) of a MRAM device from a magnetic field generated by a ferromagnetic cladded conductive interconnect. In this example, the ferromagnetic cladded conductive interconnect is oriented to produce a hard axis magnetic field to the MRAM device. From plot 6, as the current in the ferromagnetic cladded conductive interconnect is increased, the magnetoresistance response becomes non-linear and the affect of hysteresis increases. For example, the non-linear response is illustrated in a curve 8 in plot 6, which clearly illustrates hysteresis. The increased hysteresis represents the formation of domains in the ferromagnetic cladding layer which produce difficult to control magnetic fields.

It would be highly advantageous, therefore, to remedy the foregoing and other deficiencies inherent in the prior art.

Accordingly, it is an object of the present invention to provide a new and improved cladding material for magnetoresistive random access memory devices.

It is an object of the present invention to provide a new and improved cladding material which reduces the presence of domains.

It is another object of the present invention to provide a new and improved cladding material which decreases hysteresis and stray fields created by remanent states.

It is another object of the present invention to provide a new and improved cladding material that provides shielding.

SUMMARY OF THE INVENTION

To achieve the objects and advantages specified above and others, a multi-layer ferromagnetic cladded conductive interconnect for programming a MRAM device is disclosed which includes a conductive material with a length, a multi-layer ferromagnetic cladding region positioned along the length of the conductive material wherein the multi-layer ferromagnetic cladding region includes N ferromagnetic layers, where N is a whole number greater than or equal to two, and wherein the multi-layer ferromagnetic cladding region further includes at least one spacer layer and wherein the spacer layer is sandwiched therebetween each adjacent ferromagnetic layer. However, in one embodiment, the length of multi-layer ferromagnetic cladding material is formed discontinuous along the length of the MRAM device and positioned on the conductive material in the region proximate to the MRAM device. In the preferred embodiment, the conductive material includes copper and is formed using a standard copper damascene process. Typically, the spacer layer includes a conductive material, an insulating material, or a material that induces anti-ferromagnetic exchange coupling.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 1 is a micromagnetic simulation for a single ferromagnetic cladding layer structure typically used in the prior art illustrating the formation of a domain.

FIG. 2 is a plot illustrating the percent change in magnetoresistance of a MRAM device verses the hard axis current for a single ferromagnetic cladded interconnect used in the prior art.

DETAILED DESCRIPTION OF THE PREFERRED EMBODIMENT

Figure 3:
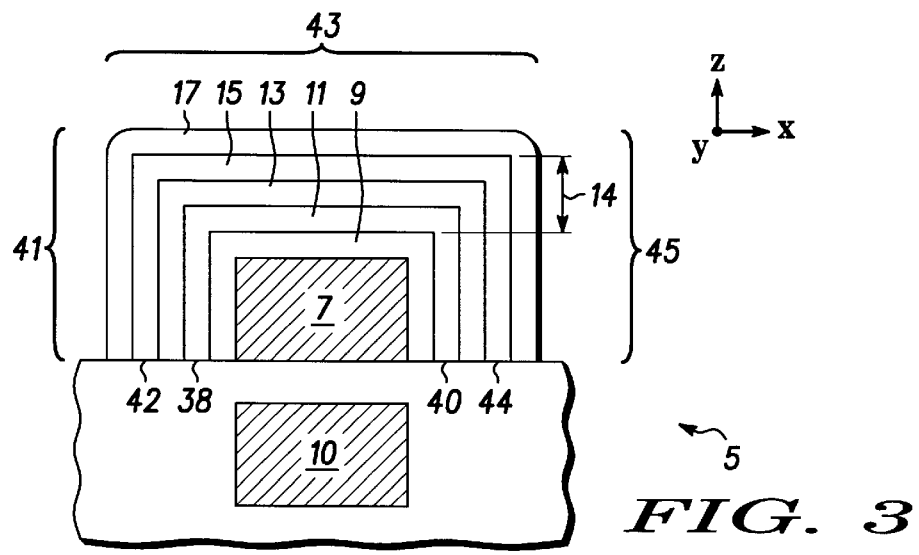
FIG. 3 is a simplified sectional view illustrating a multi-layer cladded conductive interconnect in accordance with the present invention.

Turn now to FIG. 3, which illustrates a simplified sectional view of a multi-layer ferromagnetic cladded conductive interconnect 5 for programming an MRAM device 10 in accordance with the present invention. In the preferred embodiment, multi-layer ferromagnetic cladded conductive interconnect 5 includes a conductive material 7 with a length, a first barrier conductive material 9 positioned on conductive material 7, a multi-layer cladding region 14 positioned along the length of conductive material 7 wherein multi-layer cladding region 14 includes a spacer layer 13 with a thickness sandwiched therebetween a ferromagnetic layer 11 and a ferromagnetic layer 15. In general, however, N ferromagnetic layers, where N is a whole number greater than or equal to two, can be used wherein the adjacent ferromagnetic layers are separated by a spacer layer and wherein each ferromagnetic layer has a thickness. In the preferred embodiment, N is chosen to be equal to two for simplicity and to illustrate the basic concept.

Ferromagnetic layer 11 has a boundary 40 and a boundary 38, and, in addition, ferromagnetic layer 15 has a boundary 42 and a boundary 44 which will be discussed below in more detail with reference to FIGS. 5 and 6. Boundaries 38, 40, 42, and 44 generally are oriented parallel to the length of conductive material 7.

Further, in the preferred embodiment, a second barrier conductive material 17 is positioned on multi-layer cladding region 14. However, it will be understood that first barrier conductive material 9 and second barrier conductive material 17 are both optional, but are included in the preferred embodiment for illustrative purposes.

In the preferred embodiment, multi-layer cladding region 14 is positioned proximate to MRAM device 10. It will be understood that various layer structures (not shown) could be used to position MRAM device 10 proximate to multi-layer cladding region 14. Further, conductive material 7 is capable of supplying a current to induce a magnetic field for switching MRAM device 10. In addition, the magnetic field is focused towards MRAM device 10 by multi-layer cladding region 14.

For ease of discussion, a conductive material not in physical contact with MRAM device 10 is discussed in reference to FIG. 3. However, it should be understood that while the drawings illustrate a conductive material not in physical contact with the magnetic memory device, that it is also anticipated by this disclosure to form a conductive material that is in physical contact with the MRAM device. Thus, it will be understood that in an alternative embodiment, physical contact is made between MRAM device 10 and a magnetically coupled conductive material.

Multi-layer ferromagnetic cladded conductive interconnect 5 in FIG. 3 illustrates conductive material 7 positioned above MRAM device 10. Conductive material 7 positioned thus is often referred to as a bit line. However, it will be understood that another conductive material could be positioned below MRAM device 10 in a similar manner and be referred to as a digit line. Also, it will be understood that this is a simplified view that only shows the areas of interest, and in particular multi-layer cladding region 14. Further, in this embodiment, conductive material 7 is illustrated as being stacked on MRAM device 10, but it will be understood that conductive material 7 can be positioned in other configurations relative to MRAM device 10 wherein conductive material 7 is capable of supplying a large enough magnetic field to program MRAM device 10.

In this specific embodiment, MRAM device 10 is a standard MRAM bit formed according to well-known practices in the art. While a standard MRAM bit is illustrated herein for convenience, it will be understood by those skilled in the art that many other types of semiconductor devices could be provided. Also, while a single MRAM device is illustrated for convenience it should be understood that, for example, a complete array of MRAM or other devices or control/driver circuits around the periphery of an array of magnetic memory bits may be formed.

In the preferred embodiment, the forming of the various layers included in multi-layer ferromagnetic cladded conductive interconnect 5 can be accomplished using a self-aligned process, although other semiconductor patterning and etching techniques may be used. Thus, it will be understood that multi-layer ferromagnetic cladded conductive interconnect 5 can be formed using other techniques well known to those skilled in the art, such as a standard copper damascene process.

In the preferred embodiment, conductive material 7 includes copper, but it will be understood that conductive material 7 can include other materials, such as silver, gold, aluminum, platinum, or another suitable conductive material. Typically, conductive material 7 is deposited by physical vapor deposition (hereinafter referred to as "PVD") or plating or another suitable technique well known to those skilled in the art. Further, in the preferred embodiment, at least one of the N ferromagnetic layers includes one of nickel (Ni), iron (Fe), manganese (Mn), cobalt (Co), combinations thereof, or another suitable ferromagnetic material and can be deposited by PVD or plating or another suitable technique well known to those skilled in the art.

Spacer layer 13 can include a conductive material, insulative material, or a material which creates an anti-ferromagnetic exchange coupling between each adjacent ferromagnetic layer. Suitable conductive materials for spacer layer 13 include tantalum (Ta), copper (Cu), aluminum (Al), combinations thereof, or another suitable electrically conductive material.

Suitable insulative materials for spacer layer 13 include silicon oxide, silicon nitride, aluminum oxide, or another suitable electrically insulative material. Further, suitable materials which induces an anti-ferromagnetic exchange coupling include ruthenium (Ru), rhenium (Re), osmium (Os), titanium (Ti), chromium (Cr), rhodium (Rh), platinum (Pt), copper (Cu), palladium (Pd), or combinations thereof. In addition, if spacer layer 13 includes a material which induces an anti-ferromagnetic exchange coupling, then at least one layer has a thickness that is between 4 Å and 30 Å. Typically, these spacer materials can be deposited by PVD or electrochemical plating (for uniformity control) or another suitable deposition technique well know to those skilled in the art.

In general, ferromagnetic cladding material is designed to focus the magnetic field generated by the conductive material it is poisoned on. Hence, for MRAM devices, ferromagnetic cladding material is designed to focus the magnetic field generated by the digit and bit interconnects towards the MRAM device. As discussed previously, the remanent domain structures cause stray magnetic fields proximate to MRAM device 10 and have a coercivity (no response to an applied magnetic field until a certain threshold current is supplied, i.e. hysteresis).

However, by including a spacer layer sandwiched therebetween ferromagnetic layers in multi-layer cladding region 14, the effect of the remanent behavior of the multi-layer cladding region is minimized because each adjacent ferromagnetic layer is magnetically coupled such that the plurality of magnetic moment vectors in adjacent ferromagnetic layers are anti-aligned. An anti-aligned state between adjacent ferromagnetic layers will be created by magnetostatic coupling of the plurality of magnetic moment vectors between the adjacent ferromagnetic layers. One effect of the anti-alignment of the adjacent plurality of magnetic moment vectors is to reduce the tendency for domains to form. The anti-alignment of adjacent plurality of magnetic moment vectors allows the multi-layer cladding region to relax into an anti-aligned state between adjacent ferromagnetic layers and decreases the likelihood of forming a domain. The anti-alignment of the adjacent plurality of magnetic moment vectors also reduces the stray magnetic fields created by any domain that does form. Thus, the induced charge and stray magnetic fields created by domain formation is minimized by utilizing a multi-layer ferromagnetic cladding region.

If spacer layer 13 includes an insulating or conducting material, then each ferromagnetic layer will couple magnetostatically to each adjacent ferromagnetic layer such that the plurality of magnetic moment vectors in each adjacent ferromagnetic layer will orient anti-parallel. If spacer layer 13 includes a material which induces an anti-ferromagnetic exchange coupling, then the plurality of magnetic moment vectors will align anti-parallel with each adjacent ferromagnetic layer.

In either case, however, as the magnetic field is created by an applied current, each ferromagnetic layer will saturate in the direction of the magnetic field and, therefore, create the aforementioned benefits of cladding the conductive material, e.g. improved magnetic field production for a given current and shielding. Further, as the magnetic field is reduced to zero, the plurality of magnetic moment vectors in the adjacent ferromagnetic layers will orientate anti-parallel producing a zero magnetic moment remanent state. If domains do form, however, then each adjacent ferromagnetic layer will form domains with a plurality of magnetic moment vectors oriented anti-parallel and will still produce a zero magnetic moment remanent state. Thus, by including multiple ferromagnetic layers in the cladding region, the magnetic moment vectors created by domains can be made to cancel such that the amount of charge created is minimized when there is no applied current.

Figure 4:
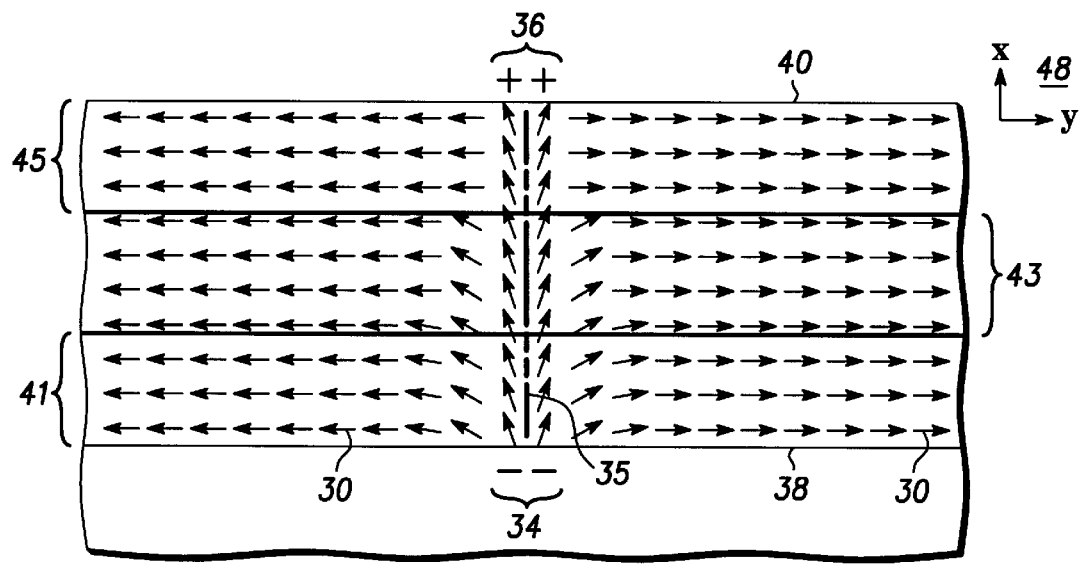
FIGS. 4 and 5 are micromagnetic simulations illustrating the reduced net magnetization for a multi-layer ferromagnetic cladding region wherein N is equal to two.
Figure 5:
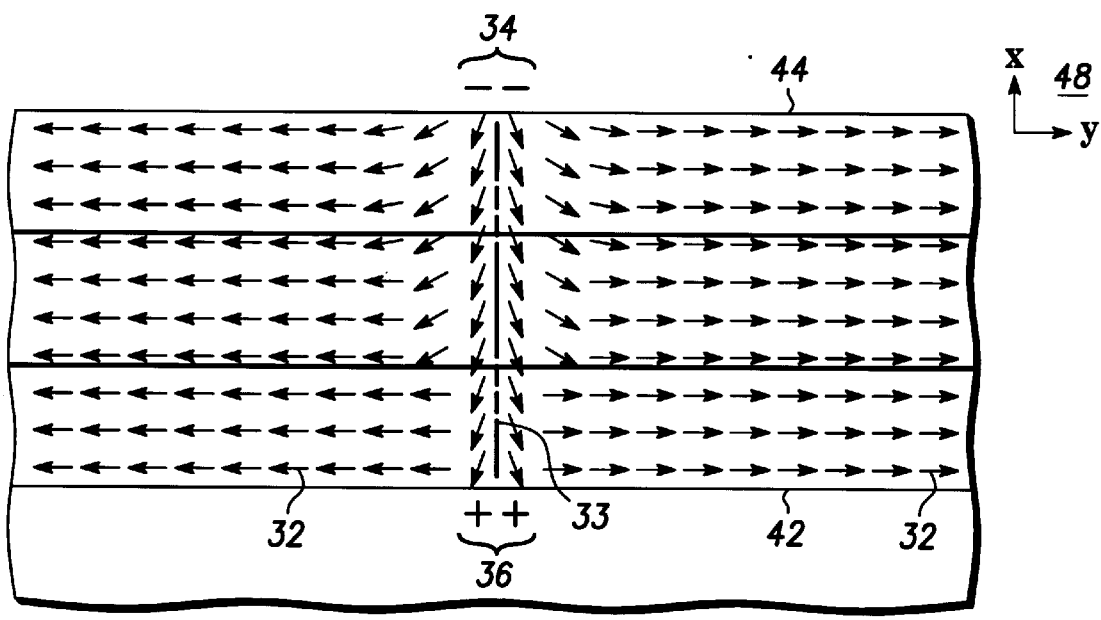

To illustrate these points, turn now to FIGS. 4 and 5 which are micromagnetic simulation results showing the resultant magnetization for multi-layer cladding region 14 wherein N is equal to two and after ferromagnetic layers 11 and 15 have been saturated. It is assumed that ferromagnetic layers 11 and 15 are 1.5 nm thick and include NiFeCo. Further, spacer layer 13 in the simulation is assumed to be an insulating material. Ferromagnetic layer 11 forms a domain 35 and ferromagnetic layer 15 forms a domain 33.

Since ferromagnetic layer 11 is coupled with ferromagnetic layer 15, plurality of magnetic moment vectors 30 will be aligned anti-parallel to plurality of magnetic moment vectors 32. Ideally, however, the plurality of magnetic moment vectors 30 and 32 should be oriented parallel or anti-parallel with the v-direction (referring to x-y coordinate system 48). However, the formation of domains 35 and 33 break the parallel or anti-parallel alignment with the x-direction (referring to x-y coordinate system 48) of plurality of magnetic moment vectors 30 and 32. Hence, in this example, plurality of magnetic moment vectors 30 orient towards boundary 40 which induces a positive charge 36 on boundary 40 and a negative charge 34 on boundary 38. Similarly, in this example, plurality of magnetic moment vectors 32 orient towards boundary 42 which induces a positive charge 36 on boundary 42 and a negative charge 34 on boundary 44. Walls 41, 43, and 45 are similarly numbered in FIGS. 3 and 4.

Figure 6:
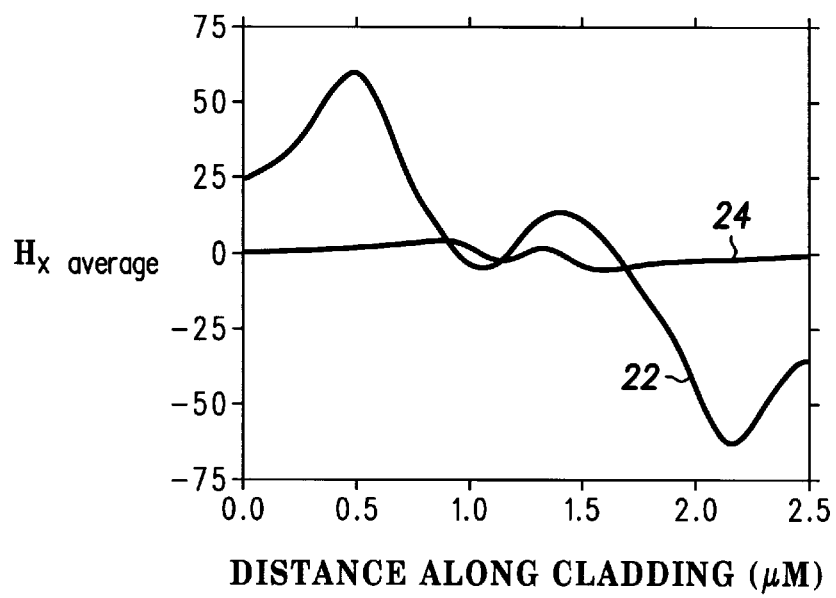
FIG. 6 is a plot illustrating the magnitude of the magnetic field along the length of the multi-layer ferromagnetic cladded conductive interconnect and the single ferromagnetic cladded conductive interconnect used in the prior art.

Turn now to FIG. 6 which illustrates a plot 20 of the magnitude of the magnetic field averaged in the x-direction (referring to x-y coordinate system 48) along the length of multi-layer ferromagnetic cladded conductive interconnect 5. A curve 22 is shown for a single ferromagnetic cladding layer and a curve 24 is shown for a multi-layer ferromagnetic cladding region. For a single ferromagnetic cladding layer, curve 22 is almost an order of magnitude larger than curve 24 for a multi-layer ferromagnetic cladding layer. The result indicates that the anti-alignment caused by the multi-layer ferromagnetic cladding structure reduces the effect of the domains by decreasing the net stray magnetic fields.

In one embodiment, the anti-aligned state between adjacent ferromagnetic layers can be stabilized by removing the ferromagnetic cladding region along the length of the conductive material in between the MRAM devices. Therefore, the ferromagnetic cladding would exist only along the length of the conductive material in close proximity to MRAM device 10 and the ferromagnetic cladding region would have a gap in the region between adjacent MRAM devices. The discontinuous ferromagnetic cladding region will enhance the magnetostatic coupling between the adjacent ferromagnetic layers and stabilize their anti-aligned arrangement.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A multi-layer ferromagnetic cladded conductive interconnect for programming a magnetoresistive memory device comprising:
   a conductive material with a length; and
   a multi-layer cladding region with a length positioned along the length of the conductive material wherein the multi-layer cladding region includes N ferromagnetic layers, where N is a whole number greater than or equal to two, and wherein the multi-layer cladding region further includes at least one spacer layer and wherein the spacer layer is sandwiched therebetween each adjacent ferromagnetic layer.

2. A multi-layer ferromagnetic cladded conductive interconnect for programming a magnetoresistive memory device as claimed in claim 1 wherein the multi-layer cladding region is sandwiched therebetween a first barrier conductive material and a second barrier conductive material.

3. A multi-layer ferromagnetic cladded conductive interconnect for programming a magnetoresistive memory device as claimed in claim 1 wherein the conductive material includes one of copper, silver, gold, platinum, and another suitable conductive material.

4. A multi-layer ferromagnetic cladded conductive interconnect for programming a magnetoresistive memory device as claimed in claim 1 wherein at least one spacer layer includes one of silicon oxide, silicon nitride, aluminum oxide, and another suitable insulator material.

5. A multi-layer ferromagnetic cladded conductive interconnect for programming a magnetoresistive memory device as claimed in claim 1 wherein at least one spacer layer includes one of Ru, Re, Os, Ti, Cr, Rh, Pt, Cu, Pd, alloys thereof, and another anti-ferromagnetic material.

6. A multi-layer ferromagnetic cladded conductive interconnect for programming a magnetoresistive memory device as claimed in claim 5 wherein at least one spacer layer has a thickness between 4 Å and 30 Å.

7. A multi-layer ferromagnetic cladded conductive interconnect for programming a magnetoresistive memory device as claimed in claim 1 wherein at least one spacer layer includes one of Ta, Cu, Al, combinations thereof, and another suitable conductive material.

8. A multi-layer ferromagnetic cladded conductive interconnect for programming a magnetoresistive memory device as claimed in claim 1 wherein at least one of the N ferromagnetic layers includes one of Ni, Fe, Mn, Co, combinations thereof, and another suitable ferromagnetic material.

9. A multi-layer ferromagnetic cladded conductive interconnect for programming a magnetoresistive memory device as claimed in claim 1 wherein the length of multi-layer cladding region is discontinuous along the length of the conductive material and positioned on the conductive material in the region proximate to the magnetoresistive random access memory device.

10. A multi-layer ferromagnetic cladded conductive interconnect for programming a magnetoresistive memory device comprising:
    a metal interconnect with a length; and
    a multi-layer cladding region with a length positioned along the length of the metal interconnect wherein the multi-layer cladding region includes a synthetic anti-ferromagnetic layer material which includes N anti-ferromagnetically coupled ferromagnetic layers, where N is a whole number greater than or equal to two, and wherein the multi-layer cladding region further includes at least one spacer layer and wherein the spacer layer is sandwiched therebetween each adjacent ferromagnetic layer.

11. A multi-layer ferromagnetic cladded conductive interconnect for programming a magnetoresistive memory device as claimed in claim 10 wherein the multi-layer cladding region is sandwiched therebetween a first barrier conductive material and a second barrier conductive material.

12. A multi-layer ferromagnetic cladded conductive interconnect for programming a magnetoresistive memory device as claimed in claim 10 wherein at least one spacer layer includes one of Ru, Re, Os, Ti, Cr, Rh, Pt, Cu, Pd, combinations thereof, and another suitable anti-ferromagnetic material.

13. A multi-layer ferromagnetic cladded conductive interconnect for programming a magnetoresistive memory device as claimed in claim 12 wherein at least one spacer layer has a thickness between 4 Å and 30 Å.

14. A multi-layer ferromagnetic cladded conductive interconnect for programming a magnetoresistive memory device as claimed in claim 10 wherein at least one of the N ferromagnetic layers includes one of Ni, Fe, Mn, Co, combinations thereof, and another suitable ferromagnetic material.

15. A multi-layer ferromagnetic cladded conductive interconnect for programming a magnetoresistive memory device as claimed in claim 10 wherein the length of the multi-layer cladding region is discontinuous along the length of the metal interconnect and positioned on the metal interconnect in the region proximate to the magnetoresistive random access memory device.

* * * * *